(12) United States Patent
Sato et al.

(10) Patent No.: US 7,280,323 B2
(45) Date of Patent: Oct. 9, 2007

(54) MAGNETORESISTANCE EFFECT ELEMENT AND MAGNETIC HEAD

(75) Inventors: Isamu Sato, Tokyo (JP); Rachid Sbiaa, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/657,504

(22) Filed: Jan. 23, 2007

(65) Prior Publication Data

US 2007/0121253 A1 May 31, 2007

Related U.S. Application Data

(63) Continuation of application No. 10/882,364, filed on Jul. 2, 2004, now Pat. No. 7,167,347.

(30) Foreign Application Priority Data

Sep. 30, 2003 (JP) .............................. 2003-342453

(51) Int. Cl.
*G11B 5/39* (2006.01)
(52) U.S. Cl. .................................. 360/324.1
(58) Field of Classification Search ............. 360/324.1, 360/324.2
See application file for complete search history.

(56) References Cited

U.S. PATENT DOCUMENTS

| | | | | |
|---|---|---|---|---|
| 5,715,121 A | * | 2/1998 | Sakakima et al. | 360/324.2 |
| 5,936,402 A | * | 8/1999 | Schep et al. | 324/252 |
| 6,046,891 A | * | 4/2000 | Yoda et al. | 360/324.1 |
| 6,052,262 A | * | 4/2000 | Kamiguchi et al. | 360/324.12 |
| 6,077,618 A | * | 6/2000 | Sakakima et al. | 428/811.5 |
| 6,452,764 B1 | * | 9/2002 | Abraham et al. | 360/324.2 |
| 6,590,750 B2 | * | 7/2003 | Abraham et al. | 360/324.2 |
| 6,731,475 B2 | * | 5/2004 | Ikeda | 360/322 |
| 6,751,072 B2 | * | 6/2004 | Freitag et al. | 360/324.11 |
| 6,804,090 B2 | * | 10/2004 | Kokado | 360/324.2 |
| 6,933,042 B2 | * | 8/2005 | Gill | 428/213 |
| 6,943,040 B2 | * | 9/2005 | Min et al. | 438/3 |
| 6,954,342 B2 | * | 10/2005 | Kula et al. | 360/324.11 |
| 7,072,153 B2 | * | 7/2006 | Koui et al. | 360/324.1 |
| 7,206,174 B2 | * | 4/2007 | Sbiaa et al. | 360/324.1 |
| 2003/0104249 A1 | * | 6/2003 | Okuno et al. | 428/693 |
| 2003/0179515 A1 | * | 9/2003 | Pinarbasi | 360/324.11 |
| 2004/0201929 A1 | * | 10/2004 | Hashimoto et al. | 360/324.1 |
| 2005/0068685 A1 | * | 3/2005 | Gill | 360/324.1 |
| 2005/0068698 A1 | * | 3/2005 | Sato et al. | 360/324.12 |
| 2005/0099724 A1 | * | 5/2005 | Nakamura et al. | 360/125 |
| 2005/0141147 A1 | * | 6/2005 | Sbiaa et al. | 360/324.2 |
| 2005/0157433 A1 | * | 7/2005 | Kamiguchi et al. | 360/324.1 |
| 2006/0119989 A1 | * | 6/2006 | Seyama et al. | 360/324.1 |

* cited by examiner

*Primary Examiner*—Jefferson Evans
(74) *Attorney, Agent, or Firm*—Kenyon & Kenyon LLP

(57) ABSTRACT

A magnetoresistance effect element has a lamination structure comprising a free layer including two ferromagnetic layers, a pinned layer including two ferromagnetic layers, and at least one nano-contact portion composed of a single ferromagnetic layer and disposed at least one portion between the free layer and the pinned layer. A distance between the free layer and the pinned layer, i.e., thickness of the nano-contact portion in the lamination direction, is not more than Fermi length, preferably less than 100 nm.

16 Claims, 3 Drawing Sheets

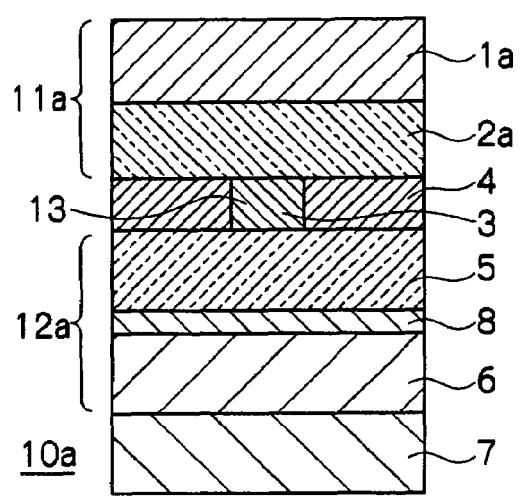
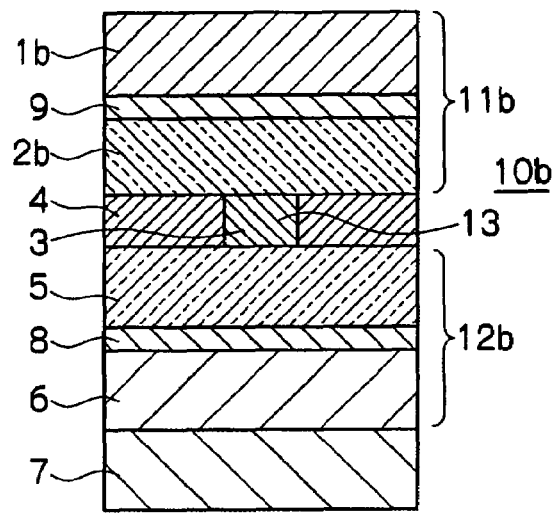
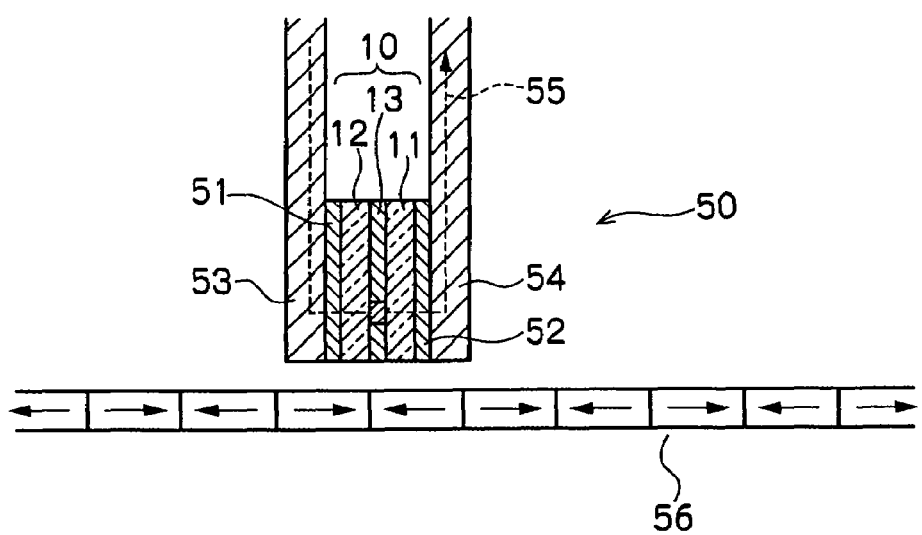

MAGNETORESISTANCE EFFECT ELEMENT AND MAGNETIC HEAD

RELATED APPLICATIONS

This application is a Continuation of prior application U.S. Ser. No. 10/882,364 filed Jul. 2, 2004, which will issue as U.S. Pat. No. 7,167,347 on Jan. 23, 2007, which claims the benefit of priority from Japanese Patent Application No. 2003-342453 filed on Sep. 30, 2003.

BACKGROUND OF THE INVENTION

1. Field of the Invention

The present invention relates to a magnetoresistance effect element particularly provided with Ballistic Magneto Resistance (BMR) effect and also relates to a magnetic head provided with such magnetoresistance effect element.

2. Relevant Art

Generally, a giant magnetoresistance effect (GMR effect) is a phenomenon indicating rate of change in magnetoresistance (called herein magnetoresistance ratio) which is developed or reviled in a case that electric current passes in a plane of a lamination structure of ferromagnetic layer/non-magnetic layer/ferromagnetic layer. Moreover, the magnetoresistance effect element of such GMR has been further actively studied for the development of more large magnetoresistance ratio, and up to now, ferromagnetic tunnel junction and a CPP (Current Perpendicular to Plane)-type MR element, in which the current passes perpendicularly with respect to the lamination structure, have been developed, and hence, has high degree of expectation for reproducing (regenerative) element for magnetic sensor, magnetic recording element and the like.

In the field of the magnetic recording technology, according to improvement of recording density, there is a continuous progress for making smaller recording bits, and as its result, it becomes difficult to obtain a sufficient signal strength. Thus, taking such matters into consideration, it has been desired for engineers in this field to search a material having high sensitive magnetoresistance effect and develop or revile an element indicating a large magnetoresistance ratio.

Recently, there has been reported, as material indicating magnetoresistance effect of more than 100%, "magnetic micro contact" which is formed by connecting two needle-like nickel (Ni) as shown, for example, in a document of "Physical Review Letters, vol. 82, p. 2923 (1999), by N. Garcia, M. Munoz, and Y. W. Zhao" (Document 1). This magnetic micro contact is manufactured by butting two ferromagnetic materials worked in form of needle or in form of triangle. More recently, there has been development of magnetic micro contact in which two fine Ni wires are arranged in T-shape and micro column is grown at a contact portion of these wires by electro-deposition method (for example, refer to a document of "Appl. Phys. Lett., Vol. 80, p. 1785 (2002), by N. Garcia, G. G. Qian, and I. G. Sveliev" (Document 2).

It is considered that an extremely high MR (Magneto Resistance) ratio developing such element is based on spin transport of a magnetic area existing in the magnetic micro contact formed between two ferromagnetic layers having magnetized directions in anti-parallel to each other. It is considered that, in the magnetoresistance effect element utilizing the magnetic micro contact having such characteristics, since electrons pass without receiving any scattering or diffusion due to impurities (i.e., pass ballistically), such magnetoresistance effect element is called BMR element (Ballistic Magneto Resistance element).

In addition, more recently, a magnetoresistance effect element having such magnetic micro contact has also been reported. For example, in Japanese Patent Laid-open (KO-KAI) Publication No. 2003-204095 (Document 3), there is reported a magnetoresistance effect element composed of first ferromagnetic layer/insulating layer/second ferromagnetic layer, in which the first ferromagnetic layer is connected to the second ferromagnetic layer at a predetermined portion of the insulating layer, the magnetoresistance effect element being provided with a hole having an opening with a diameter of less than 20 nm. Furthermore, in Japanese Patent Application National Publication (Laid-open) No. HEI 11-510911 (Document 4), there has been reported a magneto-resistance effect element composed of two magnetic layers connected to each other through a narrow segment having a width of about 100 nm.

However, in consideration of application of a BMR element to a magnetic head, a dimension of a free layer sensitive to magnetic field leaking from a surface of a medium is made small such as, for example, to several tens nm. For example, in a case of recording density of 1 Tbits/in$^2$, such dimension is of 40 to 50 nm, and in a case of a BMR element capable of realizing an extremely high MR ratio, a structure of a magnetic domain of the magnetic micro contact (called hereinlater "nano-contact portion") is a "key" of the BMR effect. As the miniaturization progresses, strong GEN magnetic field is generated from the end face of the thin free layer and thermal stability is extremely lowered, thus providing inconvenience. Therefore, in the BMR element, it is an extremely important object to ensure the magnetic domain control and magnetic stability thereof.

SUMMARY OF THE INVENTION

An object of the present invention is to substantially eliminate defects or drawbacks encountered in the prior art mentioned above and to provide a magnetoresistance effect element, particularly for a magnetic head, having BMR effect capable of achieving improved stability and sensitivity of a free layer and a magnetic domain of a nano-contact portion constituting the magnetoresistance effect element.

Another object of the present invention is to also provide a magnetic head provided with such magnetoresistance effect element.

These and other objects can be achieved according to the present invention, by providing, in one aspect, a magneto-resistance effect element comprising:

a free layer including at least two ferromagnetic layers;

a pinned layer including at least two ferromagnetic layers; and at least one nano-contact portion composed of a single ferromagnetic layer and disposed, at least one portion, between the free layer and the pinned layer, wherein a distance between the free layer and the pinned layer is not more than Fermi length.

In this aspect, the distance between the free layer and the pinned layer is preferably of not more than 100 nm, and more preferably, of not more than mean free path specific for a material constituting the nano-contact portion, being not more than 15 nm.

The nano-contact portion may have a lateral width, extending in a direction normal to a direction to the distance between the free layer and the pinned layer, preferably of not more than 100 nm, and the lateral width is more preferably of not more than mean free path specific for a material constituting the nano-contact portion, being not more than 15 nm.

The free layer may further include a non-magnetic layer disposed between the two ferromagnetic layers of the free layer and the two ferromagnetic layers of the free layer are arranged antiparallel to each other through the non-magnetic layer.

The two ferromagnetic layers of the pinned layer are may be formed of the same material or materials different from each other.

One of two ferromagnetic layers of the free layer and one of two ferromagnetic layers of the pinned layer, which are opposed to each other through the nano-contact portion, may be formed of a ferromagnetic material having a spin polarization of not less than 0.5. The ferromagnetic material forming one of two ferromagnetic layers of the free layer and one of two ferromagnetic layers of the pinned layer, as well as forming the nano-contact portion, may be a material selected from the groups consisting of a ferromagnetic metal group of Co, Fe, Ni, CoFe, NiFe, CoFeNi; a ferromagnetic metalloid group of $CrO_2$; and ferromagnetic oxide of $Fe_3O_4$.

It is preferred that an angle constituted by a direction of magnetization of the ferromagnetic layer of the free layer and a direction of the ferromagnetic layer of the pinned layer is of 90 degrees or 180 degrees.

Furthermore, an anti-ferromagnetic layer may be further disposed on the surface of the ferromagnetic layer of the pinned layer on the side apart from the nano-contact portion.

The two ferromagnetic layers of the free layer provide a ferromagnetic coupling, or the two ferromagnetic layers of the free layer provide an anti-ferromagnetic coupling.

Further, an intermediate layer is further formed between the free layer and the pinned layer, the intermediate layer including the nano-contact portion and a non-magnetic layer formed at a portion other than the nano-contact portion, and the non-magnetic layer is composed of an insulating material.

The non-magnetic layer of the insulating material may be made of an oxide such as aluminum oxide or silicon oxide or nitride such as silicon nitride.

According to the magnetoresistance effect element of the aspect and its preferred embodiments mentioned above, since the distance between the free layer and the pinned layer is defined to be not more than Fermi length, and the free layer and the pinned layer include, respectively, at least two ferromagnetic layers, it can be possible to effectively detect signals at high sensitivity due to the BMR effect. In addition, it is also be possible to reduce magnetostatic energy due to its structure and to detect generation of the magnetostatic charge at the end surfaces of the layers to thereby ensure the magnetic domain control and the magnetic stability.

In the embodiment in which these two ferromagnetic layers contained in the free layer are coupled anti-ferromagnetically through the non-magnetic layer, the magnetization of the two ferromagnetic layers of the free layer can be stabilized. As a result, magnetic field does not leak from the side end surfaces of the layers, thereby improving the stability of the entire structure of the element.

In addition, according to the embodiment in which the anti-ferromagnetic layer is formed on the two ferromagnetic layers of the pinned layer, strong switched connection can be induced, and hence, the axis of easy magnetization acting as the pinned layer can be fixed. As a result, the magnetization of the pinned layer can be strongly fixed, so that the stability of the entire structure of the element can be improved.

Furthermore, in the embodiment, in which the two ferromagnetic layers of the free layer provide a ferromagnetic coupling, high sensitivity and wide linear motion can be ensured by laminating the layer having a high spin polarization and the layer having a high soft magnetic property. On the other hand, in the embodiment in which the two ferromagnetic layers of the free layer provide an anti-ferromagnetic coupling, the magnetostatic energy can be reduced, and accordingly, the improved functions of achieving strength against disturbance and stable operation.

The above objects can be further achieved by providing, in another aspect, a magnetic head comprising:

a magnetoresistance effect element having a lamination structure;

electrodes disposed on both sides of the lamination structure of the magnetoresistance effect element; and a pair of shield members disposed on the electrodes, respectively, the magnetoresistance effect element comprising: a free layer including at least two ferromagnetic layers; a pinned layer including at least two ferromagnetic layers; and at least one nano-contact portion composed of a single ferromagnetic layer and disposed, at least a portion, between the free layer and the pinned layer, wherein a distance between the free layer and the pinned layer is not more than Fermi length.

In this aspect, a pair of permanent magnet layers is further arranged on both sides of the layer lamination structure of the magnetoresistance effect element.

In this aspect, since the magnetoresistance effect element having high stability and sensitivity in its free layer and magnetic domain of the nano-contact portion can be applied to the magnetic head, the stability of the magnetic head can be also stabilized.

The nature and further characteristic features of the present invention will be made more clear from the following descriptions made with reference to the accompanying drawings.

BRIEF DESCRIPTION OF THE DRAWINGS

In the accompanying drawings:

FIGS. 4A and 4B (FIG. 4) are sectional views illustrating other embodiments of the magnetoresistance effect element according to the present invention;

FIG. 5 is an illustration of a magnetic head as a magnetic reproduction element using the magnetoresistance effect element according to the embodiment of the present invention.

DESCRIPTION OF THE PREFERRED EMBODIMENTS

Preferred embodiments of a magnetoresistance effect element and a magnetic head utilizing the same according to the present invention will be described hereunder with reference to the accompanying drawings.

[Magnetoresistance Effect Element]

Figure 1:
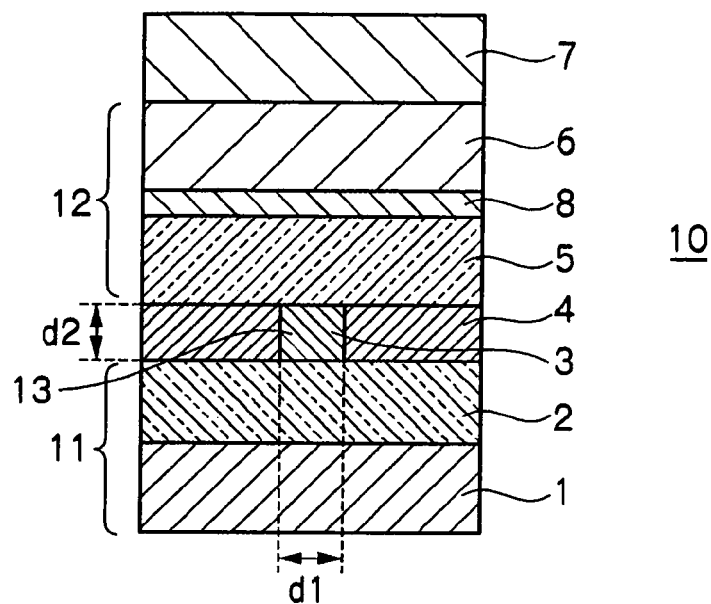
FIG. 1 is a sectional view of a magnetoresistance effect element according to one embodiment of the present invention.

One embodiment of a magnetoresistance effect element is first described with reference to FIG. 1 showing the sectional view in its layer lamination direction.

Referring to FIG. 1, a magnetoresistance effect element 10 of the present invention comprises a free layer 11 including at least two ferromagnetic layers 1, 2, a pinned layer 12 including at least two ferromagnetic layers 5, 6 and at least one (one or more than one) nano-contact portion portions 13, which are composed of one ferromagnetic layer 3, disposed between the free layer 11 and the pinned layer 12. That is, as shown in FIG. 1, in the magnetoresistance effect element 10 of this embodiment, two ferromagnetic layers 2 and 5 are disposed so as to sandwich one or more than one nano-contact portions 13 therebetween, and further in other words, one or more nano-contact portions 13 are arranged between the two ferromagnetic layers 2 and 5.

[Nano-Contact Portion]

The nano-contact portion 13 is formed from a ferromagnetic material having spin polarization of not less than 0.5, and as such ferromagnetic material, although various kinds of materials are utilized, the following ones will, for example, be listed up.

Ferromagnetic Metal Group: Co (spin polarization: 0.8); Fe (spin polarization: 0.5); Ni (spin polarization: 0.8); CoFe (spin polarization: 0.6 to 0.8); NiFe (spin polarization: 0.6 to 0.8); CoFeNi (spin polarization: 0.6 to 0.8); and so on.

Ferromagnetic Metalloid Group: $CrO_2$ (spin polarization: 0.9 to 1.0); and so.

Ferromagnetic Oxide: $Fe_3O_4$ (spin polarization: 0.9 to 1.0); and so.

In the above ferromagnetic materials, the CoFe and NiFe may be more preferable.

Figure 2:
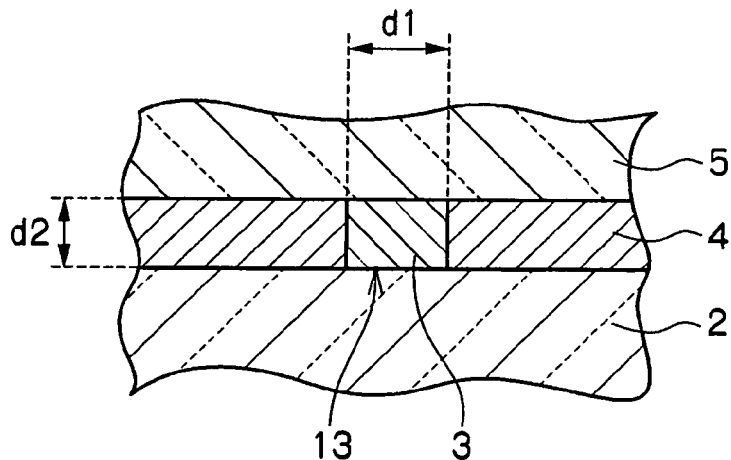
FIG. 2 is an illustration of a nano-contact portion, in an enlarged scale, of the magnetoresistance effect element of FIG. 1.

With reference to FIG. 2, showing one nano-contact portion 13, in an enlarged scale section, constituting a portion of the magnetoresistance effect element of FIG. 1, a length d1 in the width direction thereof, i.e., a direction normal to the layer lamination direction, is set to be less than the Fermi-length.

The nano-contact portion 13 is constituted so as to have a shape of circle, elliptical, rectangular (triangle, square or so) or like supposing that the magnetoresistance effect element be viewed in a plan view such as shown in FIG. 1. In this meaning, the above length d1 of the nano-contact portion 13 will be considered to be equal to the maximum length d1 in the plane in which the nano-contact portion 13 exists as viewed in the plan view of the magnetoresistance effect element 10 such as shown in FIG. 1, and accordingly, in the present invention, it will be said that the maximum length d1 of the nano-contact portion 13 is less than the Fermi length.

The Fermi length being of the length d1 of the nano-contact portion 13 in its width direction is a value specific to material (specific value or characteristic value), which is different for every material constituting the ferromagnetic material forming the nano-contact portion 13. However, many kinds of such ferromagnetic materials have the Fermi length of about 60 nm to 100 nm, so that the words "less than the Fermi length" will be prescribed as "less than 100 nm" or "less than 60 nm". In fact, Ni has the Fermi length of about 60 nm and that of Co is of about 100 nm.

Furthermore, it is more desirable that the length of the nano-contact portion 13 in its width direction is less than a mean free path. Although the value of this mean free path is also a value specific to ferromagnetic materials constituting the nano-contact portions, many of them reside in a range of about 5 nm to 15 nm. Accordingly, in this meaning, the word "less than mean free path" will be prescribed substantially equivalently as "less than 15 nm" or "less than 5 nm". In concrete examples, NiFe has a mean free path of about 5 nm and that of Co is of about 12 nm.

Incidentally, a distance between the free layer 11 and the pinned layer 12 laminated through the nano-contact portion 13 is equal to a length d2 of the nano-contact portion 13 in the layer lamination direction as viewed in the plane of FIG. 1 or 2. It is also desirable that this length (distance) d2 is also of less than the Fermi length as like as the length d1. More specifically, it is desired to be prescribed as being less than 100 nm or less than 60 nm, and moreover, it is further desirable for the length d2 to be prescribed to be less than the mean free path, i.e., less than 15 nm or less than 5 nm as mentioned above.

On the contrary, in a case that the lengths d1 and d2 in the width and lamination directions of the nano-contact portion 13 exceed the Fermi length, the thickness of the magnetic wall of the nano-contact portion 13 becomes large in the case that the magnetization shows an anti-parallel state, and hence, it becomes difficult for electron passing the nano-contact portion 13 to keep spin information. As a result, in this meaning too, it is desirable for the preferred embodiment of the present invention that the dimension of the nano-contact portion 13 (d1 and d2) is less than the Fermi length, and especially, in the viewpoint of well keeping the spin information, it is less than the mean free path.

Further, on the other hand, in the case where the lengths d1 and d2 in the width and lamination directions of the nano-contact portion 13 are less than the Fermi length, a thin wall section is generated to the magnetic wall section of the nano-contact portion 13. Accordingly, relative relationship in magnetization arrangement between the free layer 11 and the pinned layer 12, between which the nano-contact portion 13 is sandwiched, varies, and hence, electric resistance between the free layer 11 and the pinned layer 12 will also vary. In the case of the magnetoresistance effect element 10 of the present invention, since basically, there exists a magnetic field area, in which the electric resistance is reduced in accordance with the magnetic field even if magnetic field applying direction be changed, it will be said that the magnetoresistance effect produced there is the effect which is produced by the magnetic wall formed to the nano-contact portion 13. Herein, the magnetic wall of the nano-contact portion 13 acts as a transition region or area of two portions (i.e., two ferromagnetic layers 2 and 5 sandwiching the nano-contact portion 13) having different magnetized directions. Further, according to the present invention, the magnetoresistance effect more than 50% will be produced in accordance with the magnetized direction and magnitude of the applied magnetic field.

That is, in the magnetoresistance effect element 10 of the present invention, the lengths d1 and d2 in the width and lamination directions of the nano-contact portion 13 disposed between the free layer 11 and the pinned layer 12 are made to be less than the Fermi length, and in addition, these free layer 11 and pinned layer 12 are each composed of two (or at least two) ferromagnetic layers. Accordingly, it becomes possible to detect highly sensitive signals due to the BMR effect, and in addition, the magnetic domain structure control and magnetic stability can be surely improved by the magnetostatic energy reduction function due to the above structure and by the function of suppressing the generation of the magnetostatic charge appearing the end surface.

Such nano-contact portion 13 can be manufactured with high precision by fine working means such as nano-lithography micro-fabrication. Since the magnetoresistance effect element, of the present invention, provided with such nano-contact portion 13 indicates a large rate of change in magnetoresistance (called magnetoresistance ratio), it is considered that electrons can ballistically pass through the nano-contact portion 13 without any scattering of impurities. Further, the magnetoresistance changing rate mentioned above means an MR ratio (ΔR/R), which is defined by an electric resistance R at a time of sufficiently large magnetic strength and an electric resistance change ΔR at a time when an applied magnetic field is changed.

A portion (or portions) other than the nano-contact portion 13 disposed between the two ferromagnetic layers 2 and 5 is composed of (or forms) a non-magnetic layer 4, which is formed of, for example, an oxide such as aluminum oxide or silicon oxide or insulating material such as nitride of, for example, silicon nitride. The non-magnetic layer 4 has its length in the lamination direction substantially the same as the length d1 in the width direction of the nano-contact portion 13.

In the above meaning, the magnetoresistance effect element 10 of this embodiment may be said that it comprises the free layer 11, the pinned layer 12 and an intermediate layer disposed therebetween and including one or more nano-contact portions 13 and the non-magnetic layer 14.

[Ferromagnetic Layers]

The ferromagnetic layers 2 and 5 are connected via one or more nano-contact portions 13 disposed therebetween, in which the ferromagnetic layer 2 is a layer included in the free layer 11 on the nano-contact portion side and, on the other hand, the ferromagnetic layer 5 is a layer included in the pinned layer 12 on the nano-contact portion side. In the embodiment of the present invention, these ferromagnetic layers 2 and 5 are formed of a ferromagnetic material having the spin polarization of not less than 0.5. For this purpose, although various ferromagnetic materials may be utilized, the same or identical material as or to that for the nano-contact portion 13 will be preferably utilized. That is, it is desirable to select the material from the following groups of ferromagnetic metal group: Co (spin polarization: 0.8); Fe (spin polarization: 0.5); Ni (spin polarization: 0.8); CoFe (spin polarization: 0.6 to 0.8); NiFe (spin polarization: 0.6 to 0.8); CoFeNi (spin polarization: 0.6 to 0.8); Ferromagnetic Oxide: $Fe_3O_4$ (spin polarization: 0.9 to 1.0); and ferromagnetic metalloid group: $CrO_2$ (spin polarization: 0.9 to 1.0) and so on, in which CoFe or NiFe will be selected as more preferable ferromagnetic material.

In the structure that the nano-contact portion 13 and the ferromagnetic layers 2 and 5 sandwiching the nano-contact portion 13 are formed of the same ferromagnetic material, the film formation and etching processing can be made with the same ferromagnetic material and, in addition, granular structural film formation technique can be preferably utilized, thus being advantageous and effective for the manufacturing of the magnetoresistance effect element 10 of the present invention.

[Free Layer]

The free layer 11 is a layer in which magnetization is rotated in one or reverse direction in response to a magnetic field generated from a magnetization transition region (area) of a medium, and it is desired to define the direction of an axis of easy magnetization (i.e., easy axis) to be parallel to the medium. This free layer 11 is a layer composed of two ferromagnetic layers 1, 2, as mentioned before, which are disposed in ferromagnetic coupling state or anti-ferromagnetic coupling state.

Figure 3A:
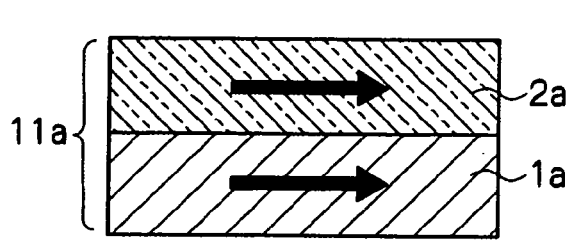
FIGS. 3A and 3B (FIG. 3) are sectional views showing examples of a free layer constituting the magnetoresistance effect element of FIG. 1.
Figure 3B:
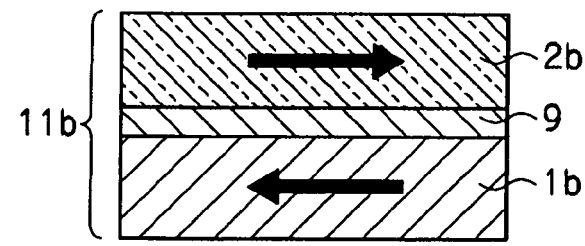

With reference to FIG. 3, FIG. 3A represents one example showing the ferromagnetic coupling of two ferromagnetic layers 1a and 2a and, on the other hand, FIG. 3B represents one example showing the anti-ferromagnetic coupling of two ferromagnetic layers 1b and 2b.

With reference to FIG. 3A, in the case that two ferromagnetic layers 1a and 2a of the free layer 11a provide the ferromagnetic coupling state, one of the ferromagnetic layers 1a disposed at a position apart from the position of the nano-contact portion 13 is formed from a material having a high spin polarization and, on the other hand, the other ferromagnetic layer 2a disposed adjacent to the nano-contact portion 13 is formed from a soft magnetic material having a small magnetostriction. According to such combined arrangement of the ferromagnetic layers of different materials, high sensitivity and wide linear motion can be effectively ensured.

As a material having the high polarization, it may be possible to utilize various kinds of ferromagnetic materials having the spin polarization of not less than 0.5, and the material of CoFe or Co will be more preferably utilized to form it generally having its thickness of about 0.5 to 5 nm. Further, as the soft material having the small magnetostriction, Ni or NiFe is specifically preferably utilized to form it generally having its thickness of about 0.5 to 5 nm.

On the other hand, with reference to FIG. 3B, in the case that the two ferromagnetic layers 1b and 2b provide the anti-ferromagnetic coupled state, the non-magnetic layer 9 is formed between these two ferromagnetic layers 1b and 2b so as to exhibit antiparallel coupling state of these ferromagnetic layers 1b and 2b through the non-magnetic layer 9. According to such structure, the magnetization of these two ferromagnetic layers 1b and 2b included in the free layer 11 is stabilized, and hence, the magnetic field does not leak from the side end surface of the layer, resulting in the improvement of the entire stability of the magnetoresistance effect element.

That is, according to the arrangement shown in FIG. 3B, since magnetostatic energy can be reduced, the magnetoresistance effect element can provide sufficient strength to disturbance and ensure its stable operation and function, thus being advantageous. In this example of arrangement, the non-magnetic layer 9 acts as a layer for regulating the degree of switched connection of these two ferromagnetic layers 1b and 2b, and, for this purpose, is formed of a material selected from the group consisting of Ru, Rh, Ir, Cu, Ag or Au, or an alloy thereof. The material for forming the non-magnetic layer 9 may be formed of the same material as that forming a non-magnetic layer 8 included in the pinned layer 12, described hereunder, thus being convenient at the time of film formation.

The ferromagnetic layers 1b and 2b providing the anti-ferromagnetic coupling are generally formed from CoFe, NiFe or like so as to have a thickness of about 0.5 to 5 nm. Furthermore, these ferromagnetic layers 1, 2 and non-magnetic layer 9 are formed by sputtering or deposition process or treatment.

[Pinned Layer]

The pinned layer 12 is called "pin layer (pinned layer)" and is provided with two (or at least two) ferromagnetic layers 5 and 6, which are arranged through the non-magnetic layer 8 disposed therebetween.

The ferromagnetic layers 5 and 6 forming the pinned layer 12 may be formed of various kinds of ferromagnetic materials having the spin polarization of not less than 0.5, and CoFe, Co or like will be more preferably utilized. In such case, these two ferromagnetic layers 5 and 6 may be formed of the same material or materials different to each other, and their thicknesses are also made equal to or different from each other, generally, to about 2 to 10 nm. The difference of these materials may slightly affect on the film formation process, which, however, does not constitute so severe problem.

The non-magnetic layer 8 sandwiched between these ferromagnetic layers 5 and 6 is formed of a material selected from the group consisting of Ru, Rh, Ir, Cu, Ag or Am, or alloy thereof so as to have a thickness, in usual, of about 0.5 to 3 nm.

These two ferromagnetic layers 5 and 6 are sectioned by the non-magnetic layer 8 so as to provide an arrangement in which the magnetization of layers 5 and 6 are in the opposite directions. According to the function of this non-magnetic layer 8, the magnetization of these two ferromagnetic layers 5 and 6 can be stabilized. As a result, since the magnetic field does not leak from the side end surface of the layer structure, the stability of the entire structure of the magnetoresistance effect element can be improved. Further, these ferromagnetic layers 5 and 6 and non-magnetic layer 8 are formed by sputtering or deposition process or treatment.

[Anti-Ferromagnetic Layer]

In the magnetoresistance effect element of the present invention, it is desirable to locate an anti-ferromagnetic layer 7 on the pinned layer 12 composed of the two ferromagnetic layers 5 and 6 so as to contact the ferromagnetic layer 6.

It will be preferred that the anti-ferromagnetic layer 7 is formed of a material selected from the group consisting of PtMn, IrMn, PtPdMn and FeMn so as to have a thickness, of about 2 to 10 nm. According to the arrangement of such anti-ferromagnetic layer, exchange coupling connection is induced, and the magnetization of the ferromagnetic pinned layer can be fixed. As a result, the magnetization of the pinned layer 12 can be strongly fixed, so that the stability of the entire structure of the magnetoresistance effect element can be improved.

Here in above, although one embodiment of the magnetoresistance effect element of the present invention is described with reference to FIGS. 1 to 3, there may be provided modified embodiments such as shown in FIG. 4 (FIGS. 4A and 4B). In magnetoresistance effect elements 10a, 10b of the modified embodiments, the free layers 11a, 11b are provided with ferromagnetic layers 1a, 2a; 1b, 2b, respectively, which are inverted in the vertical position as compared with the embodiment of FIG. 1, and also, the pinned layers 12a; 12b are provided with ferromagnetic layers 5, 6, respectively, which are inverted in the vertical position as compared with the embodiment of FIG. 1.

According to these arrangements of FIGS. 4A and 4B, the magnetoresistance effect element having far improved sensitivity can be provided, and moreover, the magnetic domain control can also be made easy.

In the magnetoresistance effect element obtainable by the present invention, although the ferromagnetic layers constituting the free layer and those constituting the pinned layer can be used as electrodes, other electrodes may be arranged independently from these ferromagnetic layers. Thus, the electric resistance between the free layer and the pinned layer obtained by the current conduction between these electrodes will vary in accordance with the relative arrangement of the magnetizations thereof.

Furthermore, in the magnetoresistance effect element of the present invention, each of the ferromagnetic layers 2 and 5 sandwiching the nano-contact portion 13 has a flat surface in form of layer to easily carry out the magnetic domain control, so that it is possible to properly arrange the distribution of the magnetization. Accordingly, it becomes possible to sharply maintain the magnetic wall width between the ferromagnetic layers 2 and 5 opposing to each other through the fine nano-contact portion 13 to thereby obtain the large magnetoresistance ratio. However, it is not always necessary for these two ferromagnetic layers 2 and 5 to provide a flat layer surface, and it may be possible to provide a slightly rough surface or curved surface.

Furthermore, the present invention may include embodiments in which one or plural nano-contact portions 13 are arranged, and in the case where plural (more than one) nano-contact portions 13 are disposed between the free layer and the pinned layer, the MR value may be slightly reduced, but, in comparison with the arrangement of the single nano-contact portion 13, the scattering of the MR values in each element could be reduced, thus easily reproducing the stable MR characteristics.

Still furthermore, in the magnetoresistance effect element of the present invention, it is preferred that an angle constituted by the direction of the magnetization of the ferromagnetic layer of the free layer and the direction of the magnetization of the ferromagnetic layer of the pinned layer is 90 degrees or 180 degrees. According to such angle arrangement, the sensitivity of the element can be improved and the linear operation or function can be easily performed.

[Magnetic Head]

A magnetic head (magneto-resistive head) formed by utilizing the magnetoresistance effect element of the present invention of the structures and characters mentioned above can provide a large reproduced sensitivity because, by utilizing such magnetoresistance effect element, the magnetoresistance ratio of more than 50% can be produced.

FIG. 5 is an illustrated example of an embodiment of the magnetic head utilizing the magnetoresistance effect element of the present invention as a magnetic reproducing element.

With reference to FIG. 5, the magnetic head 50 of this embodiment comprises: the magnetoresistance effect element 10 including the free layer 11, the pinned layer 12, the nano-contact portion 13 sandwiched between these layers 11 and 12, and electrodes 51 and 52 disposed outside the free layer 11 and the pinned layer 12, i.e., opposite to the nano-contact portion side; and shield members 53 and 54 both disposed further outside the electrodes 51 and 52. Reference numeral 55 shows a flow path of a sensing current.

In the magnetic head 50, the magnetoresistance effect element 10 is disposed so that the film surface thereof has a vertical arrangement with respect to a recording medium 56. In the illustrated arrangement, the nano-contact portion 13 is arranged in a direction approaching the recording medium 56 from the center of the magnetoresistance effect element 10. A magnetic field of a signal from the recording medium 56 becomes large as shortening the distance from the recording medium 56, and accordingly, the magnetic head having the structure in which the nano-contact portion 13 is disposed to such position provides a large magnetic field detection efficiency of the magnetic field of the free layer 11 sensitive to the magnetization, thus being effective and advantageous.

Furthermore, in the illustrated embodiment of FIG. 5, although a horizontal magnetized film is illustrated as the recording medium 56, it may be substituted with a vertical magnetized film.

Figure 6:
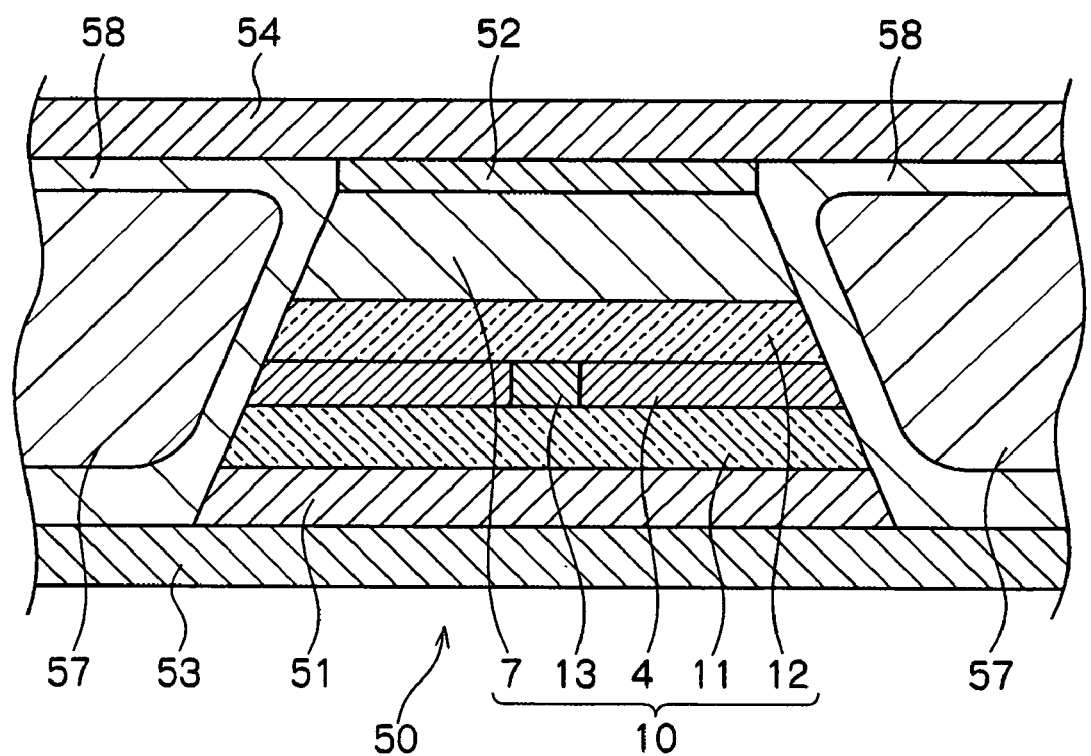
FIG. 6 is an illustrated sectional view, in an enlarged scale, of another example of the magnetic head according to the present invention.

FIG. 6 is an illustration, in an enlarged section, of one example of the magnetic head 50 viewed from the side of the recording medium 56.

With reference to FIG. 6, the magnetic head 50 is provided with the magnetoresistance effect element 10 at least including the free layer 11, the pinned layer 12, and the nano-contact portion 13 sandwiched between these layers 11 and 12, which are of the structures and characters mentioned above with reference to FIGS. 1 to 4. Furthermore, the anti-ferromagnetic layer 7 is also disposed adjacent to the pinned layer 12, and the electrodes 51 and 52 are disposed on both outsides of the magnetoresistance effect element 10. Furthermore, in this embodiment of FIG. 6, a pair of permanent magnet layers 57 is additionally arranged on both lateral sides.

For example, with reference to the magnetoresistance effect element 10 shown, in FIG. 6, from the side of the recording medium, the lamination structure thereof has arrangement of, in order from the lower side, the lower shield member 53, the electrode 51, the free layer 11, nano-contact portion 13 and non-magnetic layer 4, the pinned layer 12, the anti-ferromagnetic layer 7, the electrode 52 and the upper shield member 54. In addition, a pair of permanent magnet layers 57 formed of CoPt is also disposed on both the lateral sides in the illustrated arrangement, and insulating layers 58 are also disposed around the permanent electrodes 57.

The magnetoresistance effect element 10 of the embodiment shown in FIG. 6 has a width of 20 to 100 nm thickness, and the respective layers constituting this element 10 having a thickness in the range of 0.5 to 20 nm may be optionally selected in accordance with the recording density and the required sensitivity to be utilized. Furthermore, the one or more nano-contact portions may be formed so as to provide the thickness of 2 to 20 nm.

As mentioned above, according to the magnetoresistance effect element mounted to the magnetic head of the present invention, the easy axis of the free layer arranged in opposition to the recording medium formed of the horizontal magnetic film provides a direction parallel to the magnetization direction of the recording medium, and the magnetization of the easy axis is rotated in sensitive response to the magnetic field generated from the magnetization transition region of the recording medium. As a result, the sensing current passing the nano-contact portion varies and the leaking field of the recording medium can be extremely sensitively read out. Moreover, the magnetoresistance effect element can indicate the magnetoresistance effect more than 50% and detect the sensing current with high sensitivity, thus providing the magnetic head with reduced sensitivity loss and with improved stability in function.

It is to be noted that the present invention is not limited to the described embodiment and many other changes and modifications may be made without departing from the scopes of the appended claims.

What is claimed is:

1. A magnetoresistance effect element comprising:
a free layer including at least two ferromagnetic layers;
a pinned layer including at least two ferromagnetic layers; and
at least one nano-contact portion composed of a single ferromagnetic layer and disposed between the free layer and the pinned layer,
wherein a distance between said free layer and said pinned layer is not more than mean free path and said pinned layer further includes a non-magnetic layer disposed between the two ferromagnetic layers of the pinned layer.

2. A magnetoresistance effect element according to claim 1, wherein said distance between the free layer and the pinned layer is preferably of not more than 100 nm.

3. A magnetoresistance effect element according to claim 2, wherein said distance is more preferably of not more than mean free path specific for a material constituting the nano-contact portion, being not more than 15 nm.

4. A magnetoresistance effect element according to claim 1, wherein said nano-contact portion has a lateral width, extending in a direction normal to a direction of said distance between the free layer and the pinned layer, preferably of not more than 100 nm.

5. A magnetoresistance effect element according to claim 4, wherein said lateral width is more preferably of not more than mean free path specific for a material constituting the nano-contact portion, being not more than 15 nm.

6. A magnetoresistance effect element according to claim 1, wherein said free layer further includes a non-magnetic layer disposed between the two ferromagnetic layers of the free layer and said two ferromagnetic layers of the free layer are arranged in antiparallel to each other through the non-magnetic layer.

7. A magnetoresistance effect element according to claim 1, wherein an angle constituted by a direction of magnetization of the ferromagnetic layer of the free layer and a direction of the ferromagnetic layer of the pinned layer is of 90 degrees or 180 degrees.

8. A magnetoresistance effect element according to claim 1, wherein an anti-ferromagnetic layer is further disposed on the surface of the ferromagnetic layer of the pinned layer on the side apart from the nano-contact portion.

9. A magnetoresistance effect element according to claim 1, wherein said two ferromagnetic layers of the free layer provides a ferromagnetic coupling.

10. A magnetoresistance effect element according to claim 1, wherein said two ferromagnetic layers of the free layer provides an anti-ferromagnetic coupling.

11. A magnetoresistance effect element according to claim 1, wherein an intermediate layer is further formed between the free layer and the pinned layer, said intermediate layer including the nano-contact portion and a non-magnetic layer formed at a portion other than the nano-contact portion, said non-magnetic layer being composed of an insulating material.

12. A magnetoresistance effect element according to claim 1, wherein the nano-contact portion disposed between the free layer and the pinned layer has lengths in width and lamination directions thereof less than the mean free path.

13. A magnetic head comprising:
a magnetoresistance effect element having a lamination structure;
electrodes disposed on both sides of the lamination structure of the magnetoresistance effect element; and
a pair of shield members disposed on outside surfaces of the electrodes, respectively,
said magnetoresistance effect element comprising: a free layer including at least two ferromagnetic layers; a pinned layer including at least two ferromagnetic layers; and at least one nano-contact portion composed of a single ferromagnetic layer and disposed between the free layer and the pinned layer, wherein a distance between said free layer and said pinned layer is not more than mean free path.

14. A magnetic head according to claim 13, further comprising a pair of permanent magnets arranged on both sides of a layer lamination structure of the magnetoresistance effect element.

15. A magnetic head according to claim 13, wherein the nano-contact portion disposed between the free layer and the pinned layer has lengths in width and lamination directions thereof less than the mean free path.

16. A magnetic head according to claim 13, wherein said pinned layer further includes a non-magnetic layer disposed between the two ferromagnetic layers of the pinned layer.

* * * * *